（12）United States Patent
Lu et al.

(10) Patent No.: US 9,530,730 B2
(45) Date of Patent: Dec. 27, 2016

(54) CONFIGURABLE ROUTING FOR PACKAGING APPLICATIONS

(71) Applicant: Taiwan Semiconductor Manufacturing Company, Ltd., Hsin-Chu (TW)

(72) Inventors: Chung-Yu Lu, Hsin-Chu (TW); Hsien-Pin Hu, Zhubei (TW); Shin-Puu Jeng, Hsin-Chu (TW); Shang-Yun Hou, Jubei (TW); Tzuan-Horng Liu, Longtan Township (TW); Shih-Wen Huang, Shuishang Township (TW); Chun Hua Chang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/075,733

(22) Filed: Nov. 8, 2013

(65) Prior Publication Data
US 2015/0130082 A1    May 14, 2015

(51) Int. Cl.
*H01L 23/48*    (2006.01)
*H01L 23/52*    (2006.01)
(Continued)

(52) U.S. Cl.
CPC ....... *H01L 23/5256* (2013.01); *H01L 21/4846* (2013.01); *H01L 21/561* (2013.01); *H01L 23/49827* (2013.01); *H01L 24/92* (2013.01); *H01L 24/94* (2013.01); *H01L 24/97* (2013.01); *H01L 25/03* (2013.01); *H01L 25/0657* (2013.01); *H01L 25/50* (2013.01); *H01L 23/49816* (2013.01); *H01L 24/05* (2013.01); *H01L 24/06* (2013.01); *H01L 24/11* (2013.01); *H01L 24/13* (2013.01); *H01L 24/16* (2013.01); *H01L 24/17* (2013.01); *H01L 24/29* (2013.01); *H01L 24/32* (2013.01); *H01L 24/81* (2013.01);
(Continued)

(58) Field of Classification Search
CPC ........... H01L 23/49827; H01L 23/5382; H01L 2924/01078; H01L 2924/15311; H01L 21/76886; H01L 2224/16; H01L 2224/16225; H01L 23/147; H01L 23/49822; H01L 23/50; H01L 23/642; H01L 23/645; H01L 2924/01
USPC .......................... 257/532, E23.003, E23.147, E23.149,257/E23.173, 379, 528, 529, 530, 536, 691,257/698, 700, 725, 777; 438/25, 106, 51, 64
See application file for complete search history.

(56) References Cited

U.S. PATENT DOCUMENTS 6,148,390 A * 11/2000 MacArthur ...... H03K 19/17728
365/201
7,791,168 B2  9/2010 Horton et al.
(Continued)

*Primary Examiner* — Thao X Le
*Assistant Examiner* — Nduka Ojeh
(74) *Attorney, Agent, or Firm* — Slater Matsil, LLP

(57) ABSTRACT

Various structures having a fuse and methods for forming those structures are described. An embodiment is a method. The method comprises attaching a first die to a first side of a component using first electrical connectors. After the attaching, at least one of (i) the first die comprises a first fuse, (ii) the first side of the component comprises a second fuse, (iii) a second side of the component comprises a third fuse, the second side being opposite the first side, or (iv) a combination thereof. The method further comprises after the attaching the first die to the first side of the component, blowing the first fuse, the second fuse, the third fuse, or a combination thereof.

16 Claims, 5 Drawing Sheets

(51) Int. Cl.
 H01L 29/40 (2006.01)
 H01L 23/525 (2006.01)
 H01L 25/065 (2006.01)
 H01L 21/56 (2006.01)
 H01L 21/48 (2006.01)
 H01L 25/03 (2006.01)
 H01L 25/00 (2006.01)
 H01L 23/00 (2006.01)
 H01L 23/498 (2006.01)

(52) U.S. Cl.
 CPC ........ *H01L 24/83* (2013.01); *H01L 2224/0401* (2013.01); *H01L 2224/0557* (2013.01); *H01L 2224/06181* (2013.01); *H01L 2224/11424* (2013.01); *H01L 2224/11464* (2013.01); *H01L 2224/131* (2013.01); *H01L 2224/13082* (2013.01); *H01L 2224/13083* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16225* (2013.01); *H01L 2224/16237* (2013.01); *H01L 2224/1703* (2013.01); *H01L 2224/17181* (2013.01); *H01L 2224/2919* (2013.01); *H01L 2224/32145* (2013.01); *H01L 2224/32225* (2013.01); *H01L 2224/73204* (2013.01); *H01L 2224/81191* (2013.01); *H01L 2224/81192* (2013.01); *H01L 2224/81815* (2013.01); *H01L 2224/831* (2013.01); *H01L 2224/92* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06568* (2013.01); *H01L 2924/1032* (2013.01); *H01L 2924/10252* (2013.01); *H01L 2924/10253* (2013.01); *H01L 2924/10271* (2013.01); *H01L 2924/10272* (2013.01); *H01L 2924/12042* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 9,129,935 B1* | 9/2015 | Chandrasekar | H01L 23/50 |
| 2004/0119138 A1* | 6/2004 | Yang | H01L 23/5258 257/529 |
| 2008/0296697 A1* | 12/2008 | Hsu | H01L 23/49827 257/379 |
| 2010/0327400 A1* | 12/2010 | Choi | H01L 23/5258 257/529 |
| 2012/0161814 A1* | 6/2012 | Keeth | G11C 7/10 326/101 |
| 2013/0221499 A1* | 8/2013 | Karikalan | H01L 23/481 257/659 |

\* cited by examiner

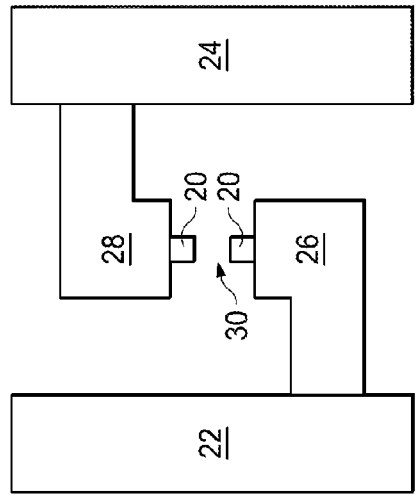
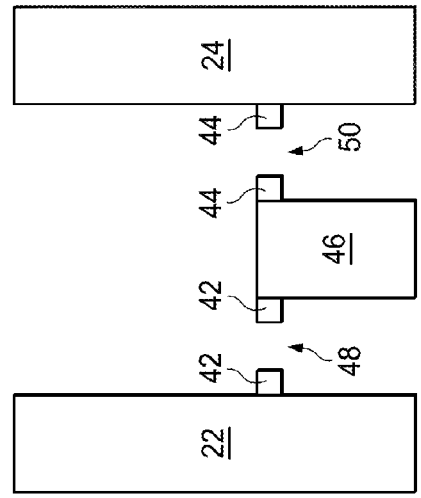
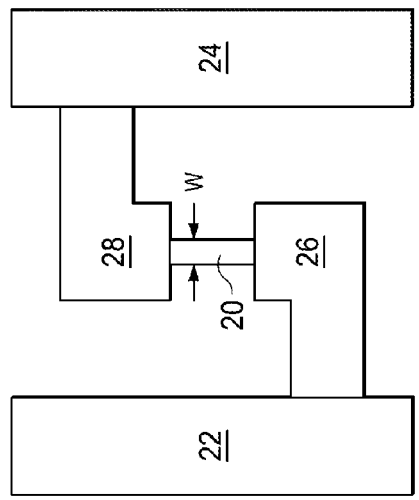
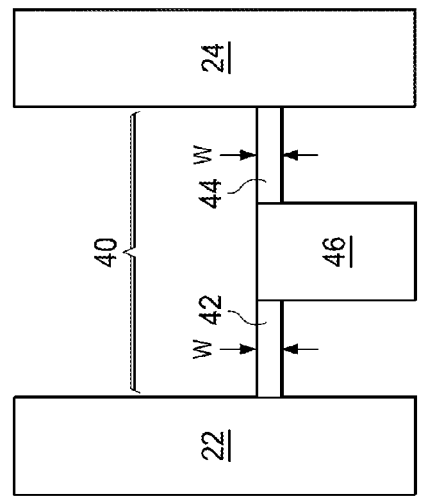

US 9,530,730 B2

CONFIGURABLE ROUTING FOR PACKAGING APPLICATIONS

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1A is a first metallization pattern including a fuse according to an embodiment;

FIG. 1B is a blown fuse after the fuse in FIG. 1A is blown according to an embodiment;

FIG. 2A is a second metallization pattern including a redundant fuse according to an embodiment;

FIG. 2B is a blown fuse after the fuse in FIG. 2A is blown according to an embodiment;

DETAILED DESCRIPTION OF ILLUSTRATIVE EMBODIMENTS

Figure 3:
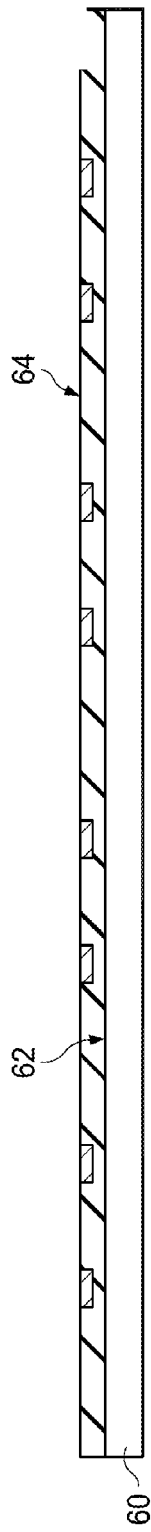
FIGS. 3 through 9 are cross sectional views in an example process according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a Die-Interposer-Substrate stacked package using Chip-on-Wafer-on-Substrate (CoWoS) processing. Other embodiments may also be applied, however, to other packages, such as Die-Die-Substrate stacked package, and other processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 illustrates a first metallization pattern including a fuse 20. The first metallization pattern may be formed in a die and/or interposer in a package. Any acceptable process may be used, as well as any acceptable material, to form the metallization pattern. For example, a damascene process, a plating process, or the like may be used.

The first metallization pattern includes a fuse 20, a first trace portion 22, a second trace portion 24, a first fuse extension 26, and a second fuse extension 28. The first trace portion 22 and the second trace portion 24 may be used as separate signal traces, separate power or voltage sources, or any combination thereof in a package. As an example, a static random access memory (SRAM) cell is electrically coupled between the first trace portion 22 and the second trace portion 24, where the first trace portion 22 is for a power supply Vcc and the second trace portion 24 is for a ground GND. Other devices and other applications of the trace portions are contemplated by other embodiments.

The first fuse extension 26 is directly connected to the first trace portion 22, and the second fuse extension 28 is directly connected to the second trace portion 24. The fuse 20 is connected between the first fuse extension 26 and the second fuse extension 28. The first fuse extension 26, the fuse 20, and the second fuse extension 28 are respectively serially coupled or linked between the first trace portion 22 and the second trace portion 24. In some embodiments, the fuse 20 may be fabricated with a minimum width W, e.g., a dimension traversing a current flow direction through the fuse, allowed for a given process node. This minimum width W of the fuse 20 may be smaller, such as much smaller, than widths of the trace portions 22 and 24 and the fuse extensions 26 and 28. Additionally, the fuse 20 may be fabricated with a minimum thickness (not illustrated), e.g., a dimension traversing the current flow direction through the fuse and perpendicular to the width W, allowed by the process node. By having a minimum width W and/or thickness, the fuse may be blown before damage occurs to the trace portions 22 and 24 or a device coupled to the trace portions 22 and 24, such as when a voltage is applied to the trace portions 22 and 24 to blow the fuse 20.

FIG. 1B illustrates a blown 30 fuse after the fuse 20 in FIG. 1A is blown. The fuse 20 may be blown by applying a high voltage on the first trace portion 22 and a low voltage, such as a ground voltage, on the second trace portion 24, or vice versa. The applied voltage generates a current through the fuse 20, and electro-migration of the material of the fuse 20 resulting from the current may cause the fuse 20 to become blown 30. In an example, the width W of the fuse 20 is 0.4 µm and the thickness is 0.85 µm, and an applied voltage resulting in a current of between approximately 30 mA and approximately 40 mA through the fuse 20 causes the fuse 20 to become blown 30. By blowing 30 the fuse 20, the first trace portion 22 and the second trace portion 24 may be electrically isolated from each other, and the first trace portion 22 and the second trace portion 24 may be different power node(s), ground node(s), and/or signal node(s).

FIG. 2A illustrates a second metallization pattern including a redundant fuse 40 comprising a first fuse portion 42, a second fuse portion 44, and a fuse trace portion 46. The second metallization pattern may be formed in a die and/or interposer in a package. Any acceptable process may be used, as well as any acceptable material, to form the metallization pattern. For example, a damascene process, a plating process, or the like may be used. The first trace portion 22 and the second trace portion 24 in FIG. 2A may be for any trace node, such as power, ground, and/or signal, and coupled to any device, such as a SRAM cell, as previously discussed with respect to FIG. 1A.

The first fuse portion 42 is directly connected between the first trace portion 22 and the fuse trace portion 46, and the second fuse portion 44 is directly connected between the second trace portion 24 and the fuse trace portion 46. In some embodiments, each of the first fuse portion 42 and the second fuse portion 44 may be fabricated with a minimum width W allowed for a given process node.

FIG. 2B illustrates a blown 48 and 50 fuse after the fuse 40 in FIG. 2A is blown. Similar to above, the fuse 40 may be blown by applying a high voltage on the first trace portion 22 and a low voltage on the second trace portion 24, or vice versa, which may blow one or both of the first fuse portion 42 and the second fuse portion 44. In other embodiments, the fuse trace portion 46 is a trace dedicated to the fuse 40; for example, the fuse trace portion 46 is not coupled to another device. In these embodiments or in other embodiment where the fuse trace portion 46 is not dedicated, the fuse 40 may be blown by applying a high voltage on the fuse trace portion 46 and a low voltage, such as a ground voltage, on the first trace portion 22 and the second trace portion 24, or vice versa. In these embodiments, devices electrically coupled to the first trace portion 22 and the second trace portion 24 may be more protected during the process to blow 48 and 50 the fuse 40 since the first trace portion 22 and the second trace portion 24 may both have a low voltage applied during the process. Further, in these embodiments, there are two fuse portions 42 and 44, which may increase the ability to isolate the first trace portion 22 from the second trace portion 24 by doubling the failure portions that serially couple the first trace portion 22 and the second trace portion 24.

Figure 8:
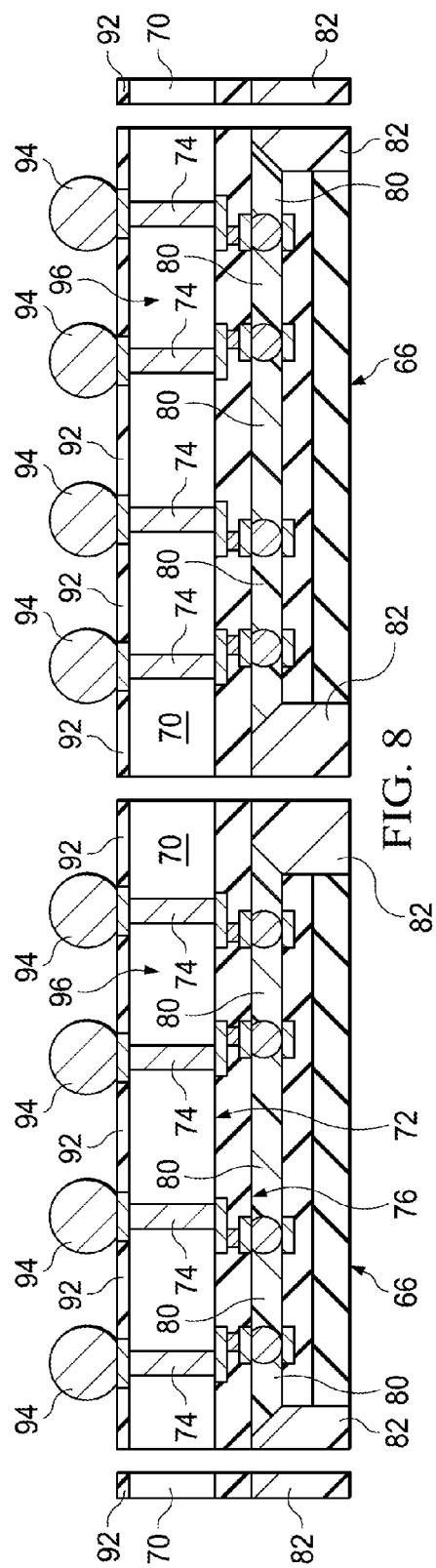
Figure 9:
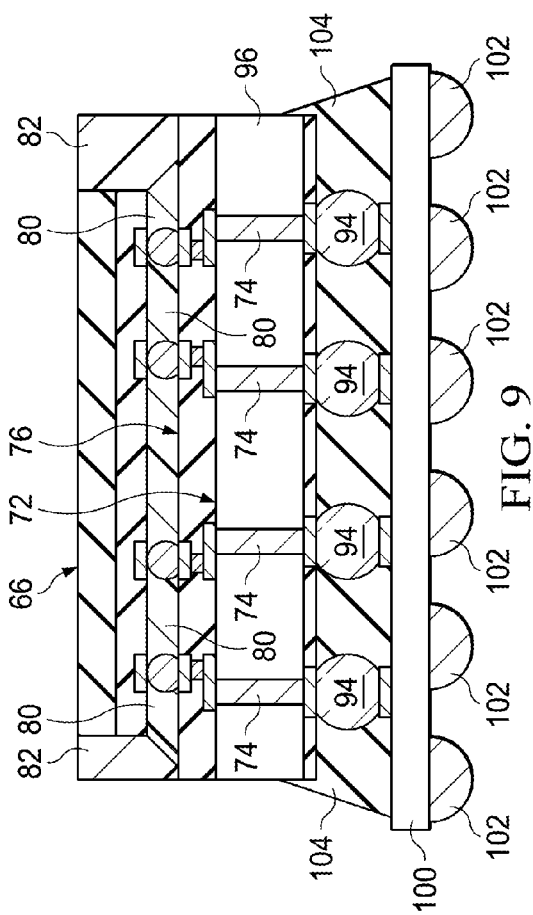
Figure 10:
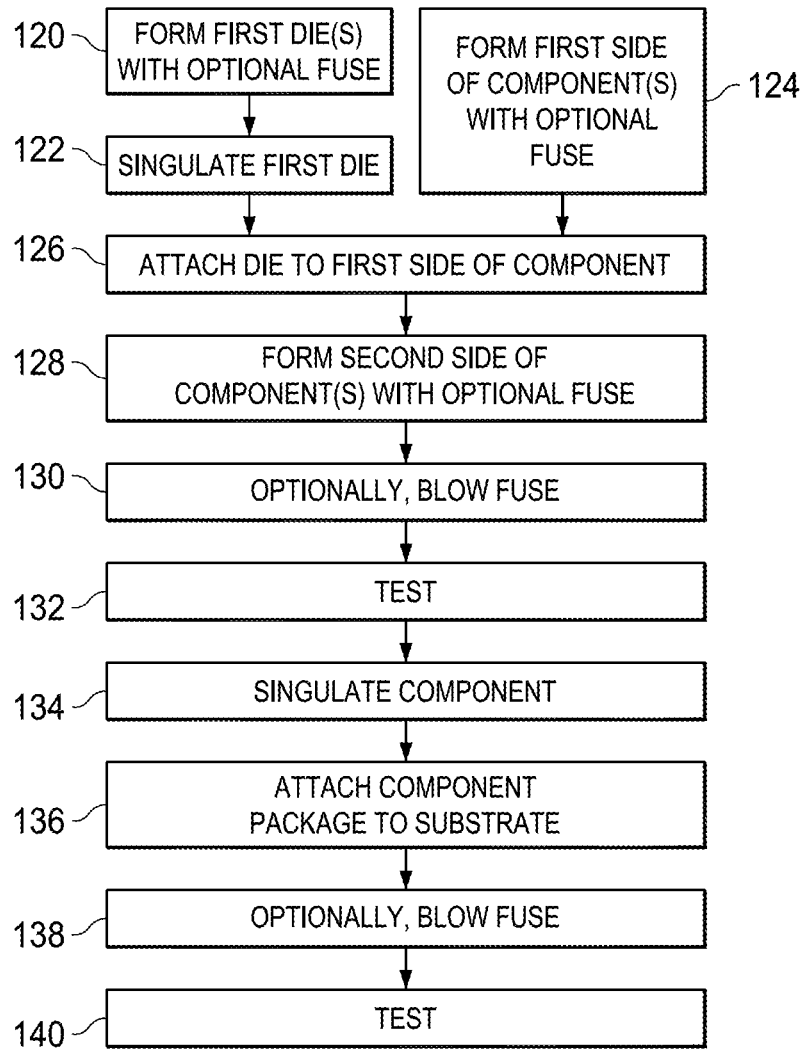
FIG. 10 is a flow chart of an example process according to an embodiment.

FIGS. 3 through 9 illustrate cross sectional views in an example process, and FIG. 10 is a flow chart of this example process. In FIGS. 3 through 9, various constituent parts are explicitly described herein but may not be specifically enumerated in the figures. A person having ordinary skill in the art will be able to readily understand and identify these parts in the figures.

FIG. 3 generically illustrates the formation of one or more first die 66 with a fuse (step 120). A substrate 60 comprises one or more first die 66 during processing. The substrate 60 in an embodiment is a wafer and may comprise a bulk semiconductor substrate, semiconductor-on-insulator (SOI) substrate, multi-layered semiconductor substrate, or the like. The semiconductor material of the substrate 60 may be silicon, germanium, silicon germanium, silicon carbide, III-V compounds, the like, or a combination thereof, and may be doped or undoped. Devices, such as transistors, capacitors, resistors, diodes, and the like, may be formed in and/or on an active surface 62 of the substrate 60.

An interconnect structure 64 comprising one or more dielectric layer(s) and respective metallization pattern(s) is formed on the active surface 62. The metallization pattern(s) in the dielectric layer(s) may route electrical signals between the devices, such as by using vias and/or traces, and may also contain various electrical devices, such as capacitors, resistors, inductors, or the like. Further, one or more of the metallization patterns in the interconnect structure 64 may comprise a fuse, such as illustrated and discussed above with respect to FIGS. 1A and 2A. The various devices and metallization patterns may be interconnected to perform one or more functions. The functions may include memory structures, processing structures, sensors, amplifiers, power distribution, input/output circuitry, or the like. Additionally, bond pads are formed in and/or on the interconnect structure 64 to provide an external electrical connection to the circuitry and devices. One of ordinary skill in the art will appreciate that the above examples are provided for illustrative purposes. Other circuitry may be used as appropriate for a given application.

More particularly, an inter-metallization dielectric (IMD) layer may be formed in the interconnect structure 64 comprising a fuse. The IMD layer may be formed, for example, of a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. A portion of the metallization pattern may correspond to a fuse, such as illustrated in FIGS. 1A and 2A. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of TaN, Ta, TiN, Ti, CoW, or the like, deposited by atomic layer deposition (ALD), or the like, and the conductive material may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP).

Figure 4:
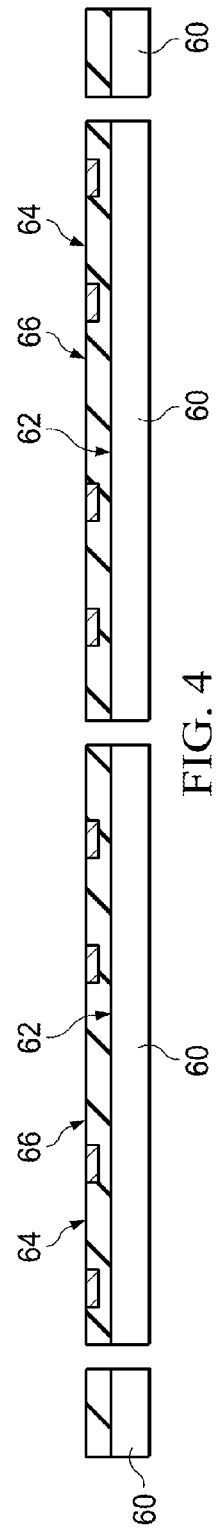

In FIG. 4, the substrate 60 including the interconnect structure 64 is singulated into individual first dies 66 (step 122). Typically, the first dies 66 contain the same circuitry, such as devices and metallization patterns, although the dies may have different circuitry. The singulation may be by sawing, dicing, or the like.

Figure 5:
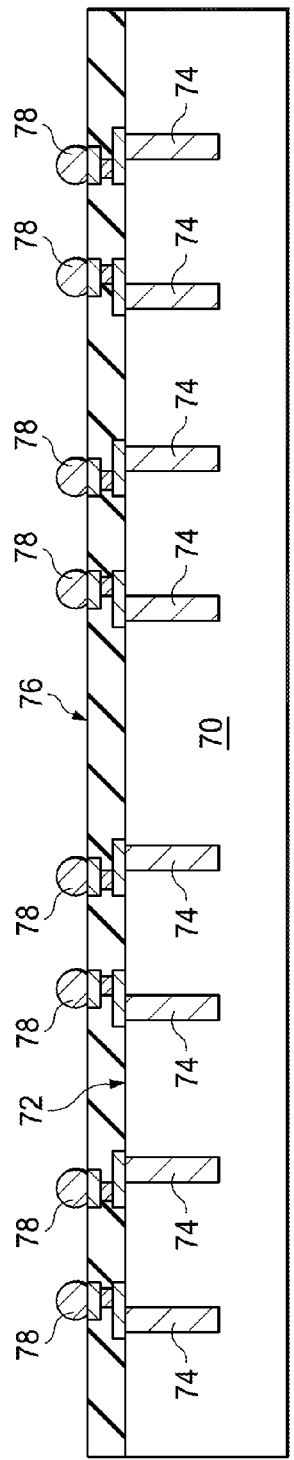

FIG. 5 generically illustrates the formation of a first side of components 96 (see FIG. 8) with a fuse (step 124). A substrate 70 comprises one or more components 96 during processing. The components 96 may be an interposer or a second die in some embodiments. The substrate 70 in some embodiments is a wafer. In embodiments where the component 96 is a second die, the substrate 70 may comprise a bulk semiconductor substrate, SOI substrate, multi-layered semiconductor substrate, or the like. The semiconductor material of the substrate 70 may be silicon, germanium, silicon germanium, silicon carbide, III-V compounds, the like, or a combination thereof, and may be doped or undoped. Devices, such as transistors, capacitors, resistors, diodes, and the like, may be formed in and/or on a first surface 72, which may also be referred to as an active surface, of the substrate 70. In other embodiments, component 96 is an interposer that generally does not include active devices therein, although the interposer may include passive devices formed in and/or on a first surface 72.

Through-vias (TVs) 74 are formed to extend from the first surface 72 of substrate 70 into substrate 70. TVs 74 are also sometimes referred to as through-substrate vias or through-silicon vias when substrate 70 is a silicon substrate. The TSVs 74 may be formed by forming recesses in the substrate 70 by, for example, etching, milling, laser techniques, a combination thereof, and/or the like. A thin dielectric material may be formed in the recesses, such as by using an oxidation technique. A thin barrier layer may be conformally deposited over the front side of the substrate 70 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 70 by, for example, CMP. Thus, the TSVs 74 may comprise a conductive material and a thin barrier layer between the conductive material and the substrate 70.

Interconnect structure 76 is formed over the first surface 72 of the substrate 70, and is used to electrically connect the integrated circuit devices, if any, and/or TVs 74 together and/or to external devices. Interconnect structure 76 may include one or more dielectric layer(s) and respective metallization pattern(s) in the dielectric layer(s). The metallization patterns may comprise vias and/or traces to interconnect any devices and/or TVs 74 together and/or to an external device. The metallization patterns are sometimes referred to as Redistribution Lines (RDL). Dielectric layers may comprise silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. Dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. A portion of the metallization pattern may correspond to a fuse, such as illustrated in FIGS. 1A and 2A. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Electrical connectors 78 are formed at the top surface of interconnect structure 76. In some embodiments, the electrical connectors are solder balls and/or bumps, such as controlled collapse chip connection (C4). In other embodiments, electrical connectors 78 comprise metal pillars, wherein solder caps may be formed on the top surfaces of the metal pillars. In yet other embodiments, electrical connectors 78 may be composite bumps comprising copper posts, nickel layers, solder caps, Electroless Nickel Immersion Gold (ENIG), Electroless Nickel Electroless Palladium Immersion Gold (ENEPIG), and/or the like.

Figure 6:
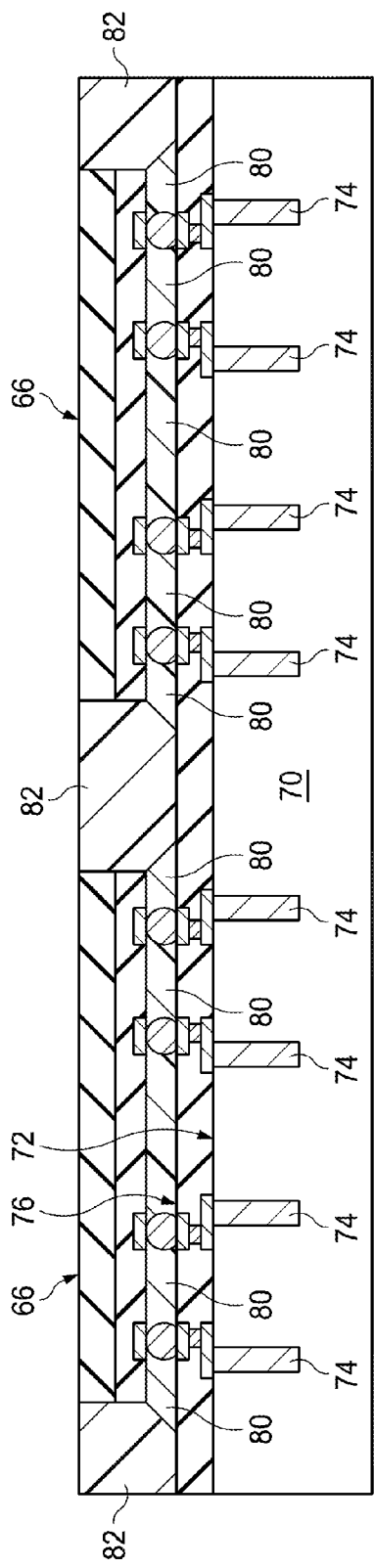

In FIG. 6, first dies 66 are attached to the first side of the components 96 (step 126), for example, through flip-chip bonding. Electrical connectors 78 electrically couple the circuits in the first dies 66 to interconnect structure 76 and TVs 74 in components 96. The electrical connectors 78 may be reflowed to create a bond between the first die 66 and the interconnect structure 76. An underfill material 80 is dispensed into the gaps between the first dies 66 and the interconnect structure 76. The underfill material 80 may be any acceptable material, such as a polymer, epoxy, molding underfill, or the like. Molding material 82 is molded on first dies 66 and components 96, for example, using compress molding. In some embodiments, molding material 82 comprises a molding compound, a polymer, an epoxy, or the like. A curing step is performed to cure molding material 82, wherein the curing may be a thermal curing, a Ultra-Violet (UV) curing, or the like. In some embodiments, the first dies 66 are buried in molding material 82, and after the curing of molding material 82, a planarization step, such as a grinding, may be performed to remove excess portions of molding material 82, which excess portions are over top surfaces of first dies 66. Accordingly, top surfaces of first dies 66 are exposed, and are level with a top surface of molding material 82.

Figure 7:
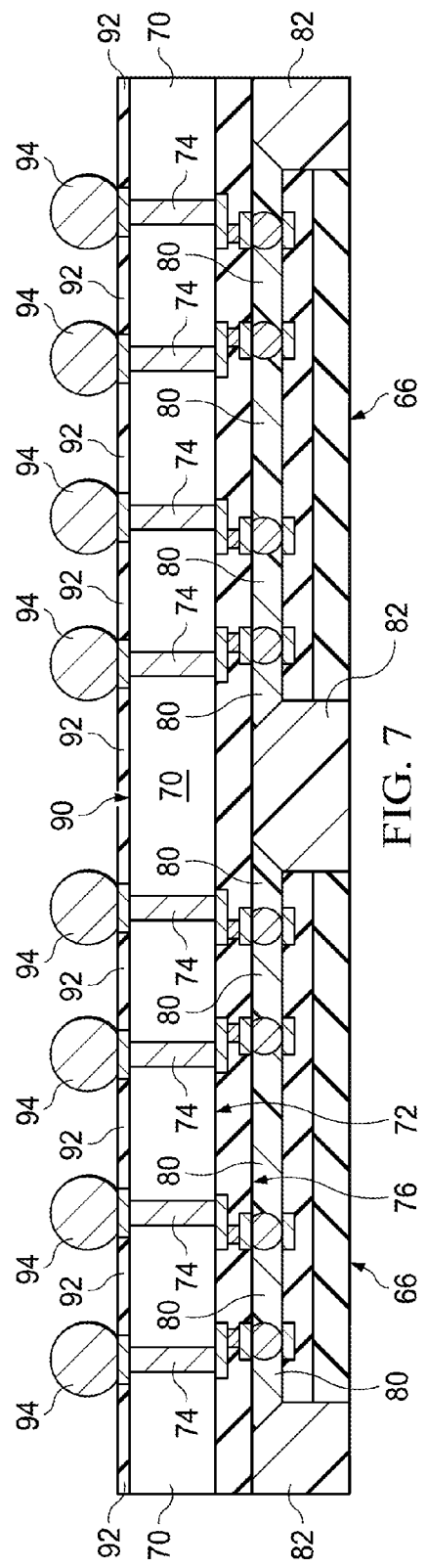

FIG. 7 illustrates the formation of the second side of components 96 with a fuse (step 128). In the formation of the second side, a grinding is performed on the second side of the substrate 70 to thin the substrate 70 to second surface 90 until TVs 74 are exposed. A dielectric layer(s) 92 is formed on the second surface 90 of the substrate 70. A metallization pattern(s) may be formed on the second surface 90 and in dielectric layer(s) 92, using similar processes as discussed above. A portion of the metallization pattern may correspond to a fuse, such as illustrated in FIGS. 1A and 2A. Electrical connectors 94 are also formed on the second side of components 96 and are electrically coupled to TVs 74. In some embodiments, electrical connectors 94 are solder balls. In other embodiments, electrical connectors 94 may comprise metal pads, metal bumps, solder caps, or the like. Electrical connectors 94 may be used to bond to an additional electrical component, which may be a semiconductor substrate, a package substrate, a Printed Circuit Board (PCB), or the like.

A fuse(s) in the interconnect structures 64 and/or 76 and/or in the dielectric layers(s) 92 may be blown or programmed (step 130) after the formation of the electrical connectors 94 and before singulation of the components 96 and/or testing (step 132) of the package(s) that are illustrated in FIG. 7. The fuse may be blown by applying appropriate voltages to electrical connectors 94 that are electrically coupled to the fuse, such as by appropriate traces, as previously discussed.

In FIG. 8, components 96 and molding material 82 are singulated (step 134) to form component packages comprising, among other things, a first die 66 and a component 96. The singulation may be by sawing, dicing, or the like.

FIG. 9 illustrates the attachment of component package on a substrate 100 (step 136). Electrical connectors 94 are aligned to, and are put against, bond pads of the substrate 100. The electrical connectors 94 may be reflowed to create a bond between the substrate 100 and the component 96. The substrate 100 may comprise a package substrate, such as a build-up substrate including a core therein, a laminate substrate including a plurality of laminated dielectric films, a Printed Circuit Board (PCB), or the like. The substrate 100 comprises electrical connectors 102, such as solder balls, opposite the component package. An underfill material 104 is dispensed between the component package and the substrate 100. The underfill material 104 may be any acceptable material, such as a polymer, epoxy, molding underfill, or the like.

A fuse(s) in the interconnect structures 64 and/or 76 and/or in the dielectric layers(s) 92 may be blown or programmed (step 138) after the dispensing of the underfill material 104 and before testing (step 140) of the package that is illustrated in FIG. 10, such as a final test. The fuse may be blown by applying appropriate voltages to electrical connectors 102 that are electrically coupled to the fuse, such as by appropriate traces, as previously discussed.

Embodiments may achieve advantages. For example, embodiments may have more controllability in implementing a circuit on a first die 66 and/or component 96. Additionally, embodiment may allow for more protection of a device, such as a SRAM cell, in the first die 66 and/or component 96 by allowing for an electrical connection to dissipate an accumulated charge during processing. Even further, embodiments may be achieved by minimal additional costs since the fuses may be formed with a metallization pattern.

An embodiment is a method comprising attaching a first die to a first side of a component using first electrical connectors. After the attaching, at least one of (i) the first die comprises a first fuse, (ii) the first side of the component comprises a second fuse, (iii) a second side of the component comprises a third fuse, the second side being opposite the first side, or (iv) a combination thereof. The method further comprises after the attaching the first die to the first side of the component, blowing the first fuse, the second fuse, the third fuse, or a combination thereof.

Another embodiment is a method. The method comprises forming a die with a die interconnect structure, forming a component interconnect structure on a first side of a component, attaching the die to the first side of the component using first electrical connectors, and forming a dielectric layer on a second side of the component. The second side is opposite the first side, and at least one of the die interconnect structure, the component interconnect structure, the dielectric layer, or a combination thereof comprises a metallization pattern having an electrical fuse. The method further comprises thereafter, programming the electrical fuse by applying a voltage and/or current.

A further embodiment is a structure comprising a first die, a component, and first electrical connectors attaching the first die to the component. The first die comprises a die interconnect structure. The component comprises a component interconnect structure and a dielectric layer. The component interconnect is on a first side of the component, and the dielectric layer is on a second side of the component. The first side is opposite from the second side. The first electrical connectors attach the first die to the first side of the component. The die interconnect structure, the component interconnect structure, the dielectric layer, or a combination thereof comprises a metallization pattern with a fuse.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   attaching a first die to a first side of a component using first electrical connectors, wherein after the attaching, a first fuse is on (i) the first die, (ii) the first side of the component, (iii) a second side of the component, the second side being opposite the first side, or (iv) a combination thereof, wherein the first fuse comprises a first fuse link in a metallization pattern in a dielectric layer, a dedicated fuse trace portion of the metallization pattern in the dielectric layer, and a second fuse link of the metallization pattern in the dielectric layer, the first fuse link being electrically coupled between a first trace portion of the metallization pattern and the dedicated fuse trace portion, the second fuse link being electrically coupled between a second trace portion of the metallization pattern and the dedicated fuse trace portion, wherein after attaching the first die to the first side of the component, the dedicated fuse trace portion is not electrically coupled to a device without a fuse link electrically coupled between the dedicated fuse trace portion and the device; and
   after the attaching the first die to the first side of the component, blowing the first fuse by applying a first voltage to the first trace portion and the second trace portion and simultaneously applying a second voltage higher than the first voltage to the dedicated fuse trace portion.

2. The method of claim 1, wherein the component is a second die.

3. The method of claim 1, wherein the component is an interposer.

4. The method of claim 1 further comprising attaching the second side of the component to a package substrate using second electrical connectors, the blowing the first fuse being performed after the attaching the second side of the component to the package substrate.

5. The method of claim 1 further comprising attaching the second side of the component to a package substrate using second electrical connectors, the blowing the first fuse being performed before the attaching the second side of the component to the package substrate.

6. The method of claim 1, wherein the first fuse is on the first side of the component.

7. The method of claim 1, wherein the first fuse is on the second side of the component.

8. The method of claim 1, wherein the component comprises through vias extending from a first surface of a substrate of the component to a second surface of the substrate of the component, the first surface being opposite from the second surface.

9. A method comprising:
   forming a die with a die interconnect structure;
   forming a component interconnect structure on a first side of a component;

attaching the die to the first side of the component using first electrical connectors;

forming a dielectric layer on a second side of the component, the second side being opposite the first side, wherein at least one of the die interconnect structure, the component interconnect structure, the dielectric layer, or a combination thereof comprises a metallization pattern having an electrical fuse, wherein the electrical fuse comprises a first fuse link, a dedicated fuse trace portion, and a second fuse link, the first fuse link being electrically coupled between a first trace portion in the metallization pattern and the dedicated fuse trace portion, the second fuse link being electrically coupled between a second trace portion in the metallization pattern and the dedicated fuse trace portion; and after attaching the die to the first side of the component and forming the dielectric layer on the second side of the component, programming the electrical fuse by applying a first voltage to the first trace portion and the second trace portion and simultaneously applying a second voltage greater than the first voltage to the dedicated fuse trace portion.

10. The method of claim 9, wherein the component interconnect structure comprises the metallization pattern having the electrical fuse.

11. The method of claim 9, wherein the dielectric layer comprises the metallization pattern having the electrical fuse.

12. A structure comprising:
a first die comprising a die interconnect structure having at least one first dielectric layer;
a component comprising a component interconnect structure having at least one second dielectric layer, and the component further comprising a third dielectric layer, the component interconnect structure being on a first side of the component, the third dielectric layer being on a second side of the component, the first side being opposite from the second side; and
first electrical connectors attaching the first die to the first side of the component,
wherein at least one of the component interconnect structure or the third dielectric layer comprises a metallization pattern with a fuse, the metallization pattern being within a single dielectric layer of the at least one first dielectric layer, the at least one second dielectric layer, and the third dielectric layer, the single dielectric layer having a uniform material composition throughout the single dielectric layer, the fuse comprising a first trace portion of the metallization pattern within the single dielectric layer, a first fuse link of the metallization pattern within the single dielectric layer, a dedicated fuse trace portion of the metallization pattern within the single dielectric layer, a second fuse link of the metallization pattern within the single dielectric layer, and a second trace portion of the metallization pattern within the single dielectric layer, the first fuse link being electrically coupled between the first trace portion and the dedicated fuse trace portion, the second fuse link being electrically coupled between the second trace portion and the dedicated fuse trace portion, the dedicated fuse trace portion not being electrically coupled to a device without a fuse link electrically coupled between the dedicated fuse trace portion and the device.

13. The structure of claim 12, wherein the fuse is a blown fuse.

14. The structure of claim 12, wherein the component is a second die.

15. The structure of claim 12, wherein the component is an interposer.

16. A method comprising:
forming a die with a die interconnect structure in at least one first dielectric layer;
forming a component interconnect structure in at least one second dielectric layer on a first side of a component;
attaching the die to the component interconnect structure of the component using first electrical connectors;
after attaching the die to the component interconnect structure of the component, forming a third dielectric layer on a second side of the component, the second side being opposite the first side, wherein at least one of the die interconnect structure, the component interconnect structure, or the third dielectric layer comprises a metallization pattern having an electrical fuse, the metallization pattern being within a single dielectric layer of the at least one first dielectric layer, the at least one second dielectric layer, or the third dielectric layer, the single dielectric layer having a uniform material composition throughout the single dielectric layer, the electrical fuse of the metallization pattern comprising a first trace portion of the metallization pattern within the single dielectric layer, a second trace portion of the metallization pattern within the single dielectric layer, a first fuse link of the metallization pattern within the single dielectric layer, a second fuse link of the metallization pattern within the single dielectric layer, and a dedicated fuse trace portion of the metallization pattern within the single dielectric layer, the first fuse link being serially coupled between the first trace portion and the dedicated fuse trace portion, the second fuse link being serially coupled between the second trace portion and the dedicated fuse trace portion, a device on the die being electrically serially coupled between the first trace portion and the second trace portion after the forming the third dielectric layer on the second side of the component, wherein after attaching the die to the component interconnect structure, the dedicated fuse trace portion is not electrically coupled to a device without a fuse link electrically coupled between the dedicated fuse trace portion and the device; and
after forming the third dielectric layer on the second side of the component, programming the electrical fuse by applying a first voltage to the dedicated fuse trace portion and simultaneously applying a second voltage to the first trace portion and the second trace portion, the first voltage being higher than the second voltage.

* * * * *